United States Patent
Jeon et al.

(10) Patent No.: US 7,358,137 B2
(45) Date of Patent: Apr. 15, 2008

(54) MEMORY DEVICES INCLUDING BARRIER LAYERS AND METHODS OF MANUFACTURING THE SAME

(75) Inventors: Sang-hun Jeon, Seoul (KR);
Chung-woo Kim, Suwon-si (KR);
Hyun-sang Hwang, Gwangju-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 11/245,426

(22) Filed: Oct. 7, 2005

(65) Prior Publication Data

US 2006/0077743 A1    Apr. 13, 2006

(30) Foreign Application Priority Data

Oct. 8, 2004    (KR) .................... 10-2004-0080353

(51) Int. Cl.
*H01L 21/336*    (2006.01)
*H01L 29/788*    (2006.01)

(52) U.S. Cl. ...................... 438/264; 257/321

(58) Field of Classification Search ............... 257/315, 257/316–321, 395, 652, E27.078, E29.3–E29.309; 438/263, 627, 643, 653
See application file for complete search history.

(56) References Cited

U.S. PATENT DOCUMENTS

| | | | | |
|---|---|---|---|---|
| 5,734,174 | A | * | 3/1998 | Horiguchi ..................... 257/17 |
| 5,936,258 | A | * | 8/1999 | Imamura et al. ............... 257/21 |
| 6,407,435 | B1 | * | 6/2002 | Ma et al. ...................... 257/411 |
| 2005/0040481 | A1 | * | 2/2005 | Shimizu et al. ............. 257/411 |

FOREIGN PATENT DOCUMENTS

KR    2005-0043135    5/2005

OTHER PUBLICATIONS

Korean Office Action dated Apr. 12, 2005, with English translation.
* cited by examiner

*Primary Examiner*—Calvin Lee
(74) *Attorney, Agent, or Firm*—Harness, Dickey & Pierce, P.L.C.

(57) ABSTRACT

Memory devices and methods of manufacturing the same are provided. Memory devices may include a substrate, a source region and a drain region and a gate structure. The gate structure may be in contact with the source and drain regions, and may include a barrier layer. The barrier layer may be formed of at least two layers. The at least two layers may have different bandgap energies.

17 Claims, 6 Drawing Sheets

US 7,358,137 B2

MEMORY DEVICES INCLUDING BARRIER LAYERS AND METHODS OF MANUFACTURING THE SAME

PRIORITY STATEMENT

This application claims priority under 35 U.S.C. §119 of Korean Patent Application No. 10-2004-0080353, filed on Oct. 8, 2004, in the Korean Intellectual Property Office (KIPO), the entire contents of which are incorporated herein by reference.

BACKGROUND OF THE INVENTION

1. Field of the Invention

Example embodiments of the present invention relate to memory devices (e.g., nonvolatile memory devices), which may include at least one barrier (e.g., multilayered tunneling barrier) and methods of manufacturing the same. For example, in one or more example embodiments of the present invention, a tunneling barrier layer may be formed in a nonvolatile memory device using a plurality of dielectric layers and methods of manufacturing the same. The dielectric layers may have different bandgap energies.

2. Description of the Related Art

A semiconductor memory device may be a volatile memory device or a nonvolatile memory device. A volatile memory device may be a memory, such as, a dynamic random access memory (DRAM), a static random access memory (SRAM), etc. If power is supplied to a volatile memory device, data may be input to, or output from, the device. If power is interrupted, data may be lost. In a nonvolatile memory device, if power is interrupted, the memory device may retain the data stored therein. A flash memory device is an example of a nonvolatile memory device.

FIG. 1 is a cross sectional view showing an example structure of a related art nonvolatile memory device, for example, a floating gate type flash memory device. Referring to FIG. 1, a source region 12a and/or a drain region 12b may be implanted with dopant (e.g., impurities). The source region 12a and/or the drain region 12b may be prepared in a substrate (e.g., a semiconductor substrate) 11. A channel region 13 may be formed in, or on, the substrate 11, for example, between the source and drain regions 12a and 12b. A gate structure 14 may be formed on the channel region 13. The channel region 13 may be in contact with the source and/or drain regions 12a and 12b. The gate structure 14 may include a barrier layer (e.g., tunneling barrier layer) 15, a floating gate 16, an oxide layer (e.g., a blocking oxide layer) 17, and/or a gate electrode layer 18. The barrier layer 15, gate 16, layers 17 and 18 may be formed, for example, sequentially. The gate electrode layer 18 may be formed of a conductive material. The barrier layer 15 may be formed of a dielectric material, and the floating gate 16 may be formed of, for example, polysilicon or any other suitable, similar material.

In the related art nonvolatile memory device shown in FIG. 1, the types and/or thicknesses of respective layers may be at, or near, a physical limit. For example, the barrier layer 15 may not be formed to less than a thickness of about 6 to 7 nm.

SUMMARY OF THE INVENTION

Example embodiments of the present invention provide memory devices (e.g., nonvolatile memory devices), which may be structurally improved, may enhance data retention time and/or data writing/erasing speed, and methods of manufacturing the same.

An example embodiment of the present invention provides a memory device, which may include a substrate, source and drain regions formed within the substrate and/or a gate structure formed on the substrate. The gate structure may contact the source and/or drain regions, and may include a barrier layer formed of at least two layers having different bandgap energies.

Another example embodiment of the present invention provides a method of manufacturing a memory device. In an example embodiment of the method, a gate structure including a barrier layer having at least two layers may be formed on a substrate. Both lateral portions of the gate structure may be etched to expose surfaces of the substrate. The surfaces of the substrate may be implanted with dopant to form a source region and a drain region.

Another example embodiment of the present invention provides a barrier layer structure for use in a memory device. The barrier layer structure may include a first barrier layer, a second barrier layer and a third barrier layer. The first barrier layer may be formed on the substrate. The second barrier layer may be formed on the first barrier layer and may have a higher bandgap energy than the first barrier layer. The third barrier layer may be formed on the second barrier layer and may have a lower bandgap energy than the second barrier layer. In example embodiments of the present invention, the barrier layer may be a multilayered tunneling barrier layer.

Another example embodiment of the present invention provides a method of manufacturing a barrier layer structure for use in a memory device. A first barrier layer may be formed on the substrate. A second barrier layer may be formed on the first barrier layer using a material having a higher bandgap energy than the first barrier layer. A third barrier layer may be formed on the second barrier layer using a material having a lower bandgap energy than the second barrier layer.

In example embodiments of the present invention, the barrier layer and/or barrier layer structure may be a multilayered tunnelling barrier layer.

In example embodiments of the present invention, the gate structure may further include the barrier layer, a floating gate, a blocking oxide layer, and/or a gate electrode layer formed sequentially.

In example embodiments of the present invention, the gate structure may further include the barrier layer or barrier layer structure, a charge storage layer, a blocking oxide layer, and/or a gate electrode layer, formed sequentially.

In example embodiments of the present invention, the barrier layer and/or barrier layer structure may further include a first barrier layer formed on the substrate and contacting the source and drain regions, a second barrier layer formed on the first barrier layer, and a third barrier layer formed on the second barrier layer. The second barrier layer may have a wider energy bandgap than the first and/or third barrier layers, and/or may be formed of at least one of $SiO_2$, $SiN$, and $Al_2O_3$. The first and/or third barrier layers may be formed of at least one of MO, MSiO, MSiON, and MON, and M may be at least one of Hf, Zr, Ti, Ta, Al, Ln (lanthanized series) and an alloy metal.

In example embodiments of the present invention, a first barrier layer may be formed on the substrate. A second barrier layer may be formed on the first barrier layer using a material having a higher bandgap energy than the first barrier layer. A third barrier layer may be formed on the second barrier layer using a material having a lower bandgap energy than the second barrier layer.

BRIEF DESCRIPTION OF THE DRAWINGS

Example embodiments of the present invention will become more apparent by describing in detail example embodiments of the present invention with reference to the attached drawings in which.

DETAILED DESCRIPTION OF EXAMPLE EMBODIMENTS OF THE PRESENT INVENTION

Memory devices (e.g., nonvolatile memory devices), which may include a tunneling barrier layer (e.g., a multi-layered tunneling barrier layer) and methods of manufacturing the same according to example embodiments of the present invention will now be described with reference to the accompanying drawings.

Figure 1:
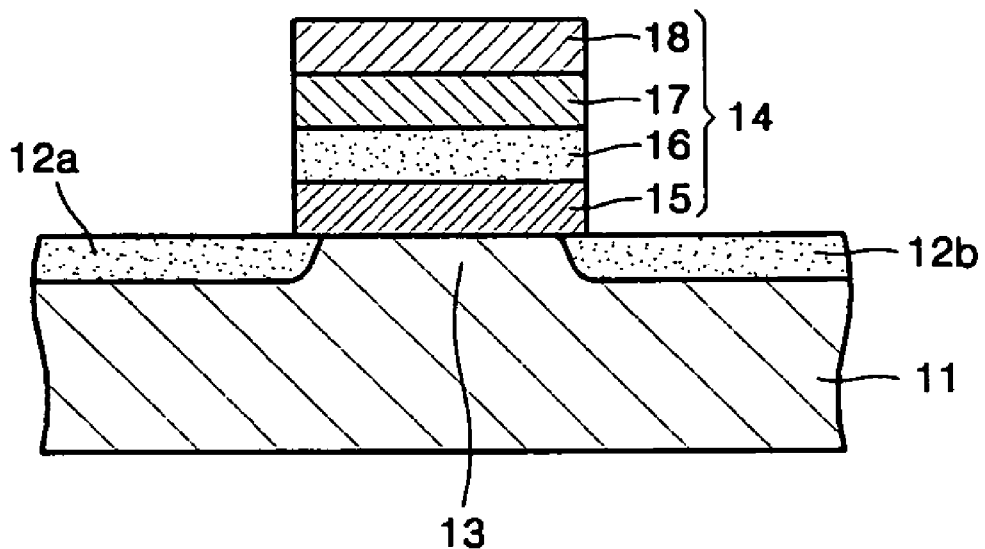
FIG. 1 is a cross sectional view of a related art nonvolatile memory device.
Figure 2:
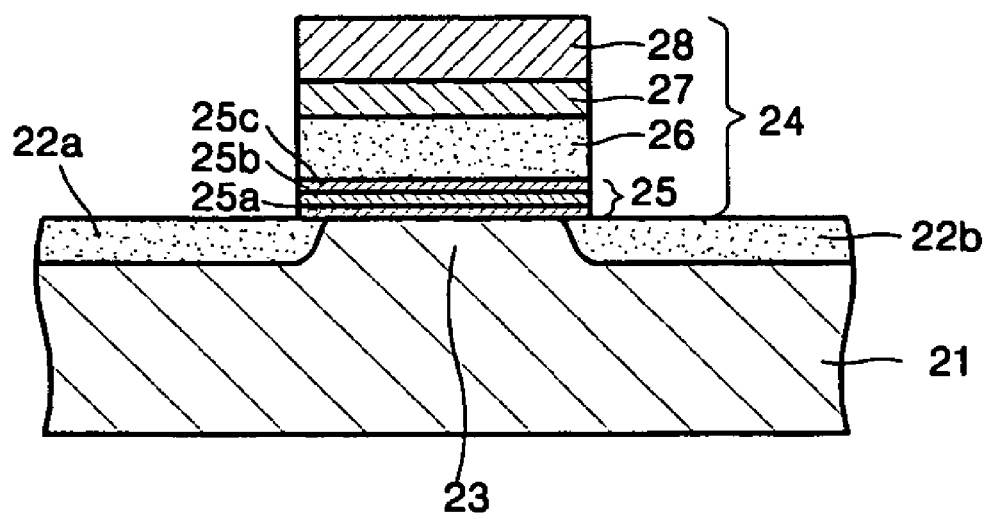
FIG. 2 is a cross sectional view of a memory device according to an example embodiment of the present invention.

FIG. 2 is a cross sectional view of a memory device (e.g., a nonvolatile memory device) according to an example embodiment of the present invention. The memory device of FIG. 2 may include a barrier layer (e.g., a barrier layer structure and/or a multilayered tunneling barrier layer) in accordance with another example embodiment of the present invention.

Referring to FIG. 2, a source region 22a and a drain region 22b may be implanted with dopant (e.g., impurities). The source region 22a and/or the drain region 22b may be prepared in, or on, a substrate 21 (e.g., semiconductor substrate). A channel region 23 may be formed in, or on, the substrate 21, for example, between the source and drain regions 22a and 22b. A gate structure 24 may be formed on the channel region 23, and may be in contact with the source and drain regions 22a and/or 22b. The gate structure 24 may include a barrier layer 25 (e.g., a tunneling barrier layer), a floating gate 26, a blocking oxide layer 27, and/or a gate electrode layer 28, which may be formed, for example, sequentially.

In example embodiments of the present invention, the barrier layer 25 may be a multilayered structure including, for example, at least two layers of material. For example, the barrier layer 25 may include at least three material layers at least one of which may have a different bandgap energy relative to the others. In the example embodiment shown in FIG. 2, the barrier layer 25 is formed of three layers 25a, 25b, and 25c.

The barrier layer 25 may be in contact, for example, vertically, with the channel region 23 of the substrate 21 and/or in contact with the floating gate 26. First and/or third barrier layers 25a and 25c, which may contact the channel region 23 and/or the floating gate 26, respectively, may be formed of, for example, a material having a narrower bandgap energy as compared to a second barrier layer 25b. The second barrier layer 25b may be interposed between the first and the third barrier layers 25a and 25b.

For example, the first and/or third tunneling barrier layers 25a and 25c may be insulating layers formed of a dielectric material including, but not limited to, MO, MSiO, MSiON, MON, or any other suitable dielectric material. M may be Hf, Zr, Ti, Ta, Al, Ln (lanthanized series), an alloy metal thereof, or any other suitable conductive material.

Figure 4A:
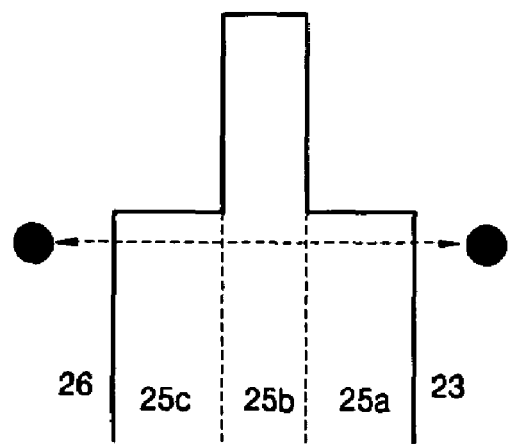
FIGS. 4A through 4C are energy band diagrams of a barrier layer of the memory device according to an example embodiment of the present invention.
Figure 4B:
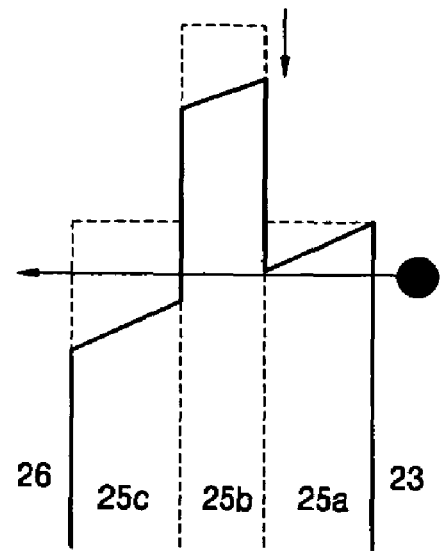
Figure 4C:
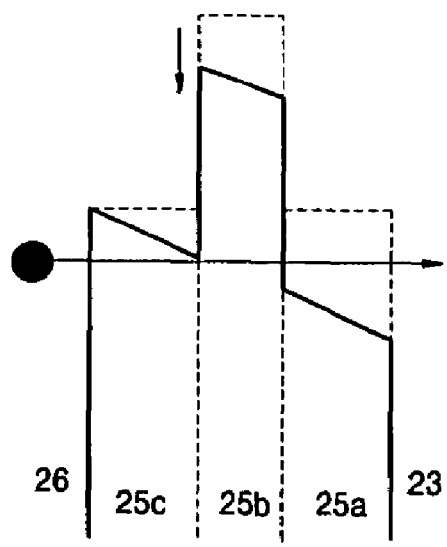

The second barrier layer 25b may be formed of a material having a wider bandgap energy relative to the first and/or third barrier layers 25a and 25c. For example, the second barrier layer 25b may be formed of $SiO_2$, $Al_2O_3$, $Si_3N_4$, or any other suitable oxide or nitride material. FIGS. 4A through 4C are example energy band diagrams of a barrier layer (e.g., multilayered tunneling barrier layer 25) according to one or more example embodiments of the present invention.

Barrier layers according to one or more example embodiments of the present invention may be applied to, for example, a silicon-oxide-nitride-oxide-silicon (SONOS), or any other suitable memory device, in addition to the floating gate type flash memory device illustrated in FIG. 2.

FIGS. 3A through 3E are cross sectional views illustrating a method of manufacturing a memory device (e.g., nonvolatile memory device) according to an example embodiment of the present invention. The memory device may include a barrier layer (e.g., a multilayered tunneling barrier layer) in accordance with an example embodiment of the present invention. In one or more example embodiments of the present invention, the barrier layer may be formed using, for example, an atomic layer deposition (ALD) process, chemical vapor deposition (CVD) process, a combination thereof, or any other suitable formation process.

Referring to FIG. 3, a first barrier layer 25a may be formed on a substrate 21. The substrate 21 may be a silicon or any other suitable substrate. The first barrier layer 25a may be an insulating layer formed of dielectric material, for example, MO, MSiO, MSiON, MON, or any other suitable dielectric material, where M may be Hf, Zr, Ti, Ta, Al, Ln (lanthanized series), an alloy metal thereof, or any other suitable conductive material. The first barrier layer 25a may be formed of about 1% to about 50% by weight of M.

Figure 3A:
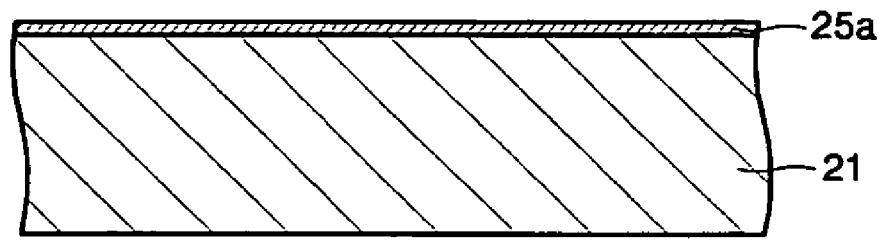
FIGS. 3A through 3E are cross sectional views illustrating a method of manufacturing a memory device according to an example embodiment of the present invention.
Figure 3B:
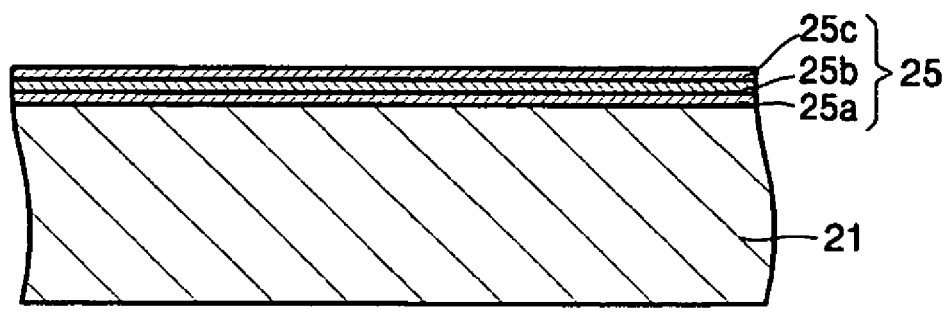

As shown in FIG. 3B, a second barrier layer 25b (e.g., tunneling barrier layer) and a third barrier layer 25c (e.g., tunneling barrier layer) may be formed (e.g., sequentially) on the first barrier layer 25a. The second and/or third barrier layers 25b and 25c may be formed of a dielectric material, such as, MO, MSiO, MSiON, MON, or any other suitable dielectric material. For example, the third barrier layer 25c may be formed of the same, or different, material as the first barrier layer 25a. The second barrier layer 25b may be formed of a material having a bandgap energy relative to the first and/or third barrier layers 25a and 25c. A material having a higher dielectric constant may have a narrower bandgap energy. In example embodiments of the present invention, when the second barrier layer 25b is formed of, for example, $SiO_2$, $Al_2O_3$, or $Si_3N_4$, the third barrier layer 25c may be formed of a material having a higher dielectric constant $k_2$.

Figure 3C:
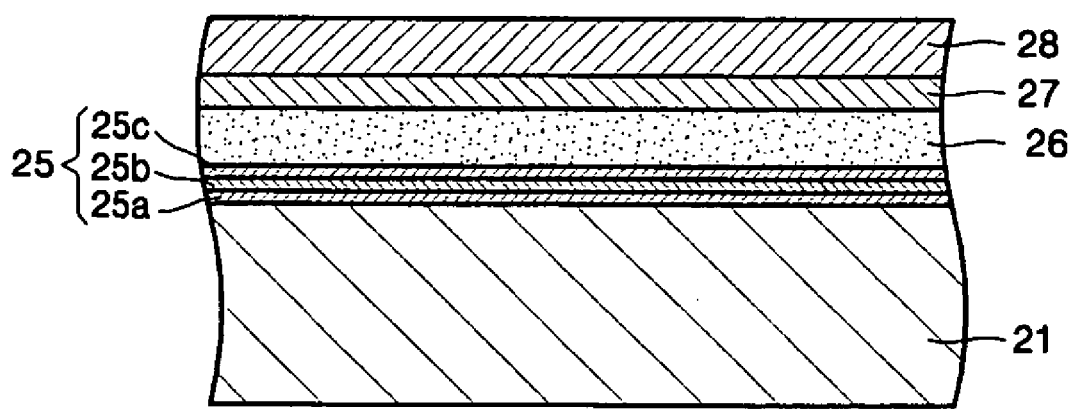

As shown in FIG. 3C, a floating gate 26, a blocking oxide layer 27, and a gate electrode layer 28 may be formed (e.g., sequentially formed) on the barrier layer 25. The floating gate 26 may be formed by depositing, for example, polysilicon or any suitable conductive (e.g., metallic) material. The blocking oxide layer 27 may be formed, for example, by depositing an insulating dielectric material (e.g., silicon oxide or any other suitable dielectric material).

Figure 3D:
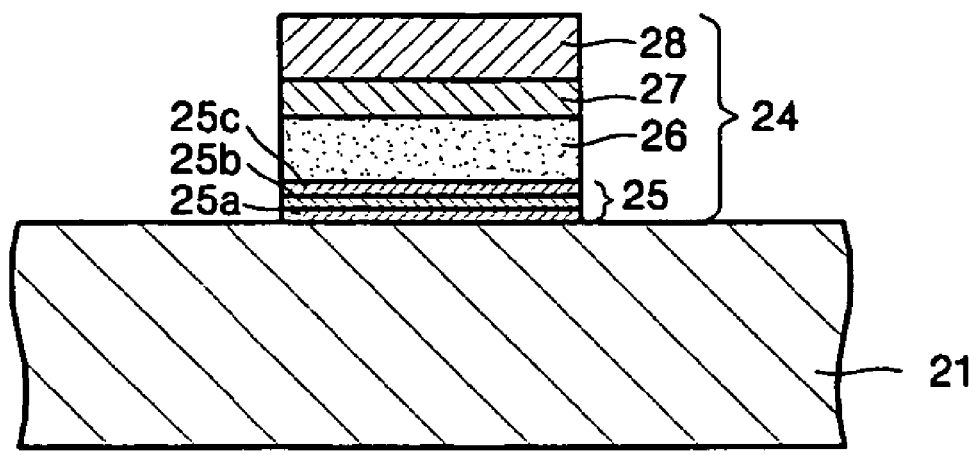

As shown in FIG. 3D, at least one or both lateral portions of the barrier layer 25, the floating gate 26, the blocking oxide layer 27, and/or the gate electrode layer 28 may be etched, forming the gate structure 24. One or both lateral top portions of the substrate 21 may be exposed defining source and drain regions 22a and 22b.

Figure 3E:
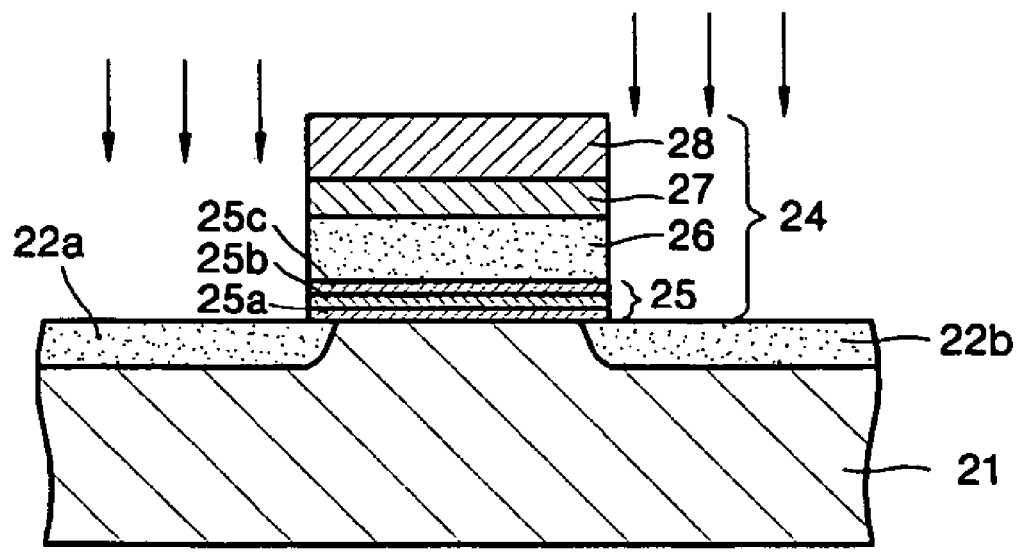

As shown in FIG. 3E, one or both lateral top portions of the substrate 21 may be implanted with dopant (e.g., impurities) forming the source region 22a and a drain region 22b. A memory device (e.g., a nonvolatile memory device) including a multilayered tunneling barrier layer according to an example embodiment of the present invention is thus manufactured.

An example operation the memory device including a barrier layer (e.g., multilayered tunneling barrier layer) according to example embodiments of the present invention will be described with reference to FIGS. 2 and 4A through 4C.

In an example write operation, when a voltage of $V_g$ is applied to the gate electrode layer 28, electrons may be emitted from the channel 23 and injected through the barrier layer 25 into the floating gate 26. A channel hot electron injection (CHEI) method or any other suitable technique may be selectively applied. In this example, charging the floating gate 26 with charges may be referred to with a data value of '1.' In an example erase operation, when a voltage of $-V_g$ is applied through the gate electrode layer 28, charges may be emitted from the floating gate 26 and injected through the barrier layer 25 into the channel 23. In this example, charges from the floating gate 26 may be referred to with a data value of '0.'

In an example read operation, when a voltage of $V_g'$ is applied to the gate electrode layer 28 and a voltage of $V_d'$ is applied to the drain 22b, the transistor (e.g., a MOSFET or any other suitable transistor) may remain turned on. In this example, a current between the source 22a and drain 22b larger than a reference current may indicate a data value of '0.' In another example, a current between the source 22a and drain 22b less than a reference current may indicate a data value of '1.' For example, a state where the floating gate 26 is charged with charges may be referred to as a data value of '0,' while a state where the charges are emitted from the floating gate 26 may be referred to as a data value of '1.'

As noted above, FIGS. 4A through 4C are example energy band diagrams of the barrier layer 25 of the memory device according to one or more example embodiments of the present invention, for example, as shown in FIG. 2.

FIG. 4A illustrates a state in which little or no external power is supplied. Since the second barrier layer 25b has higher bandgap energy than the first and/or third barrier layers 25a and/or 25c, the barrier layer 25 may have a higher central portion. In this example, when little or no power is supplied, charges may not be transported from the channel 23 to the floating gate 26 and/or from the floating gate 26 to the channel 23.

FIG. 4B illustrates transport of charges from the channel 23 through the barrier layer 25 into the floating gate 26 during an example write operation in which a voltage of $V_g$ is applied to the gate electrode layer 28. In the example write operation, the charges may not be transported through the third barrier layer 25c. This may facilitate injection of the charges into the floating gate 26.

FIG. 4C illustrates transport of charges from the floating gate 26 through the barrier layer 25 into the channel region 23 during an example erase operation. In an example erase operation, a voltage of $-V_g$ may be applied to the gate electrode layer 28. In this example, charges may not be transported through the first barrier layer 25a, which may facilitate emission of the charges from the floating gate 26.

In memory devices according to example embodiments of the present invention, an intermediate region of the barrier layer 25 may be formed of a material having a higher bandgap energy and charges may be injected into and/or emitted from the floating gate 26 more easily. Memory device according to example embodiments of the present invention may improve charge retention characteristics.

Figure 5A:
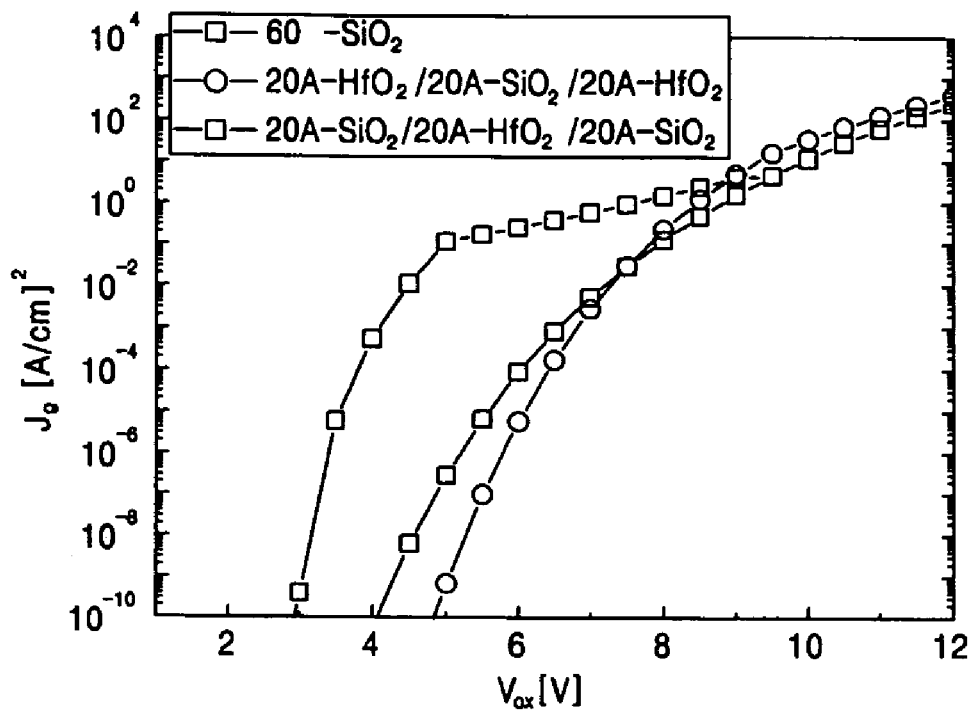
FIG. 5A is a graph showing a comparison of leakage current characteristics in a related art barrier layer and a barrier layer according to an one or more example embodiments of the present invention.

FIG. 5A is a graph showing leakage current characteristics of three samples of a barrier layer (e.g., tunneling barrier layer). A first sample of the barrier layer was formed of $SiO_2$ to a thickness of about 60 Å. A second sample of the barrier layer was formed of $HfO_2/SiO_2/HfO_2$ to a thickness of about 20 Å/20 Å/20 Å. A third sample of the barrier layer was formed of $SiO_2/HfO_2/SiO_2$ to a thickness of about 20 Å/20 Å/20 Å. A bandgap energy diagram of the second sample of the barrier layer 25 is the same, or substantially the same, as shown in FIG. 4A, and a bandgap energy diagram of the third sample of the barrier layer 25 may have a quantum well (QW) structure. Although, barrier layers according example embodiments of the present invention are described with regard to a quantum well (QW) structure, example embodiments of the present invention may have any suitable structure.

In comparison with the first sample formed according to the related art, the second sample formed according to one or more example embodiments of the present invention may exhibit a lower leakage current at a lower applied voltage and/or a higher current (e.g., tunneling current) at a higher applied voltage. As shown in FIG. 5A, memory devices according to one or more example embodiments of the present invention may have improved characteristics as compared to related art memory devices.

Figure 5B:
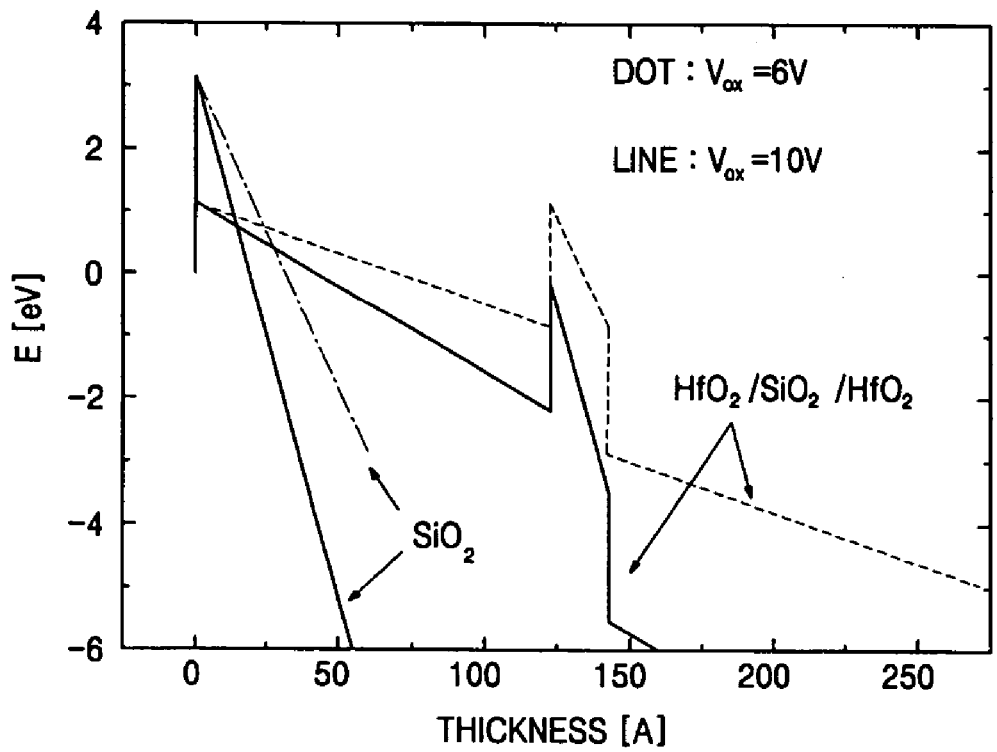
FIG. 5B illustrates a modified band diagram illustrating a voltage applied to each of a related art barrier layer and a barrier layer according to one or more example embodiments of the present invention the present invention.

FIG. 5B illustrates a modified bandgap energy diagram with respect to a voltage applied to each of a first sample and a second sample. The first sample is a related art barrier layer (e.g., multilayer tunneling barrier layer) formed of a single $SiO_2$ layer, and the second sample is a barrier layer (e.g., a tunneling barrier layer) according to an example embodiment of the present invention formed of, for example, $HfO_2/SiO_2/HfO_2$. Voltages of 6V and 10V ($V_g$) were applied to each of the first and second samples. Referring to FIG. 5B, the second sample exhibited lower (e.g., substantially lower) bandgap energy when a higher voltage of 10V was applied as compared to when a lower voltage of 6V was applied. The first sample exhibited a smaller (e.g., little) variation of bandgap energy with respect to the applied voltage. As shown from the comparison in FIG. 5A, the second sample, according to an example embodiment of the present invention, exhibited a lower leakage current at a lower applied voltage and a higher tunneling current at a higher applied voltage.

The barrier layer formed of $HfO_2/SiO_2/HfO_2$ according to an example embodiment of the present invention may exhibit a higher, or substantially higher, coupling ratio. A coupling ratio is a value representing influence of the voltage applied to the gate electrode 28 on a potential of the floating gate 26. The coupling ratio may be expressed, for example, as shown in Equation (1):

$$r_{CR} = \frac{C_{tunnel}}{C_{blocking-O_x} + C_{tunnel}} \qquad (1)$$

The coupling ratio $r_{CR}$ may represent an efficiency of applied voltage. As the coupling ratio $r_{CR}$ approximates 1, applied voltage may be used more efficiently. When the $SiO_2$ layer of FIG. 5B is used as a barrier layer, $C_{block}$ may be 0.25, $C_{tunnel}$ may be 0.5, and the coupling ratio $r_{CR}$ may be about 0.67. In comparison, when the $HfO_2/SiO_2/HfO_2$ layer of FIG. 5B is used as a barrier layer, $C_{block}$ may be about 0.25, $C_{tunnel}$ may be about 0.8, and the coupling ratio $r_{CR}$ may be about 0.78.

Figure 6:
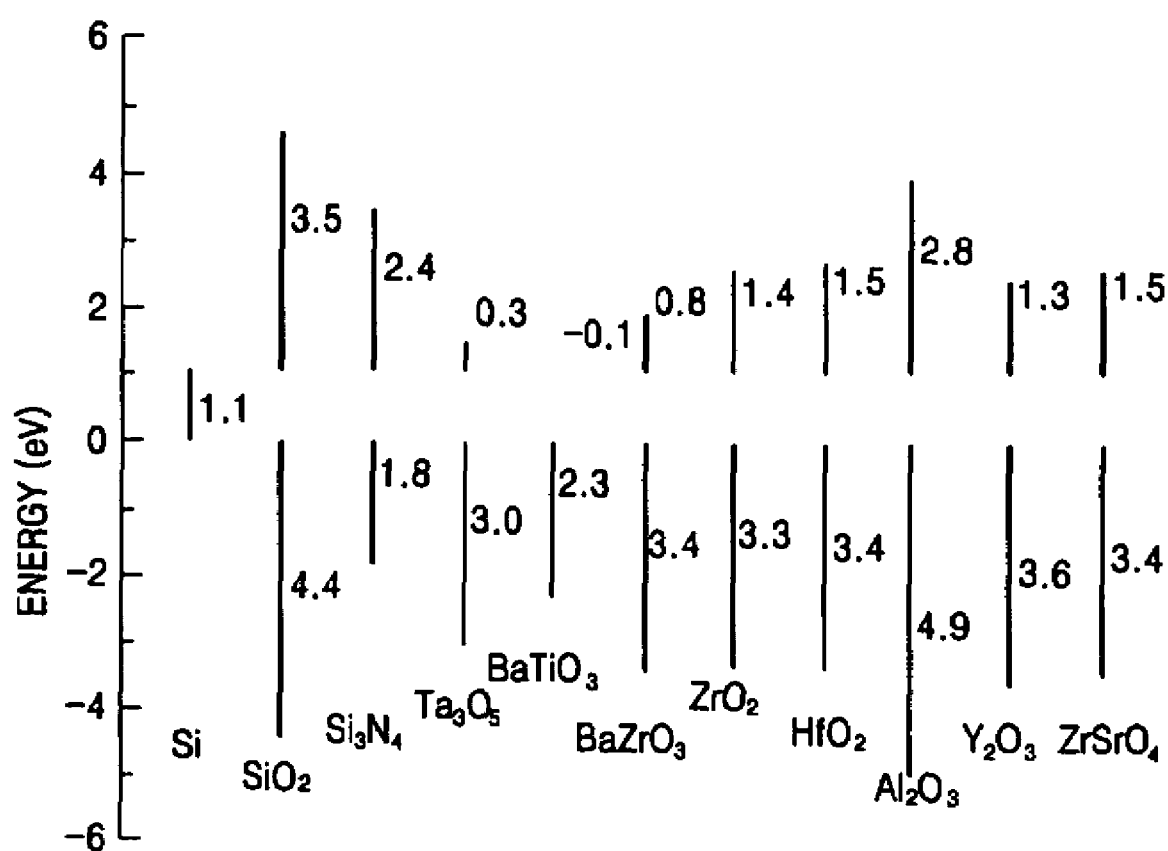
FIG. 6 illustrates bandgap energies of various materials.

Barrier layers according to one or more example embodiments of the present invention may be designed considering bandgap energy of a material, and FIG. 6 may illustrate bandgap energies of various materials. Referring to FIG. 6, an intermediate portion of the barrier layer may be formed of, for example, $SiO_2$, $Al_2O_3$, or any other suitable dielectric material, and both outer portions of the barrier layer may be formed of a material having lower bandgap energy, for example, $HfO_2$, $ZrO_2$ or any other suitable dielectric material. Although example embodiments of the present invention have been described herein with regard to a trilayer structure, barrier layers according to example embodiments of the present invention may have any structure formed of at least two layers. For example, an intermediate layer and/or one outer layer of the at least two layers may be formed of a material having a higher bandgap energy, and other layers may be formed of materials having lower bandgap energies.

According to one or more example embodiments of the present invention, a memory device (e.g., nonvolatile semiconductor memory device) may include a barrier layer (e.g., a multilayered tunneling barrier layer). The barrier layer according to one or more example embodiments of the present invention may be formed of at least two layers. Example embodiments of the present invention may provide reduced leakage current may improve data retention characteristics, write and/or erase data from a floating gate more efficiently.

Example embodiments of the present invention have been described; however, although specific terms are employed, they are used in a generic and descriptive sense only and not for purposes of limitation. Example embodiments of the present invention may be applied to, for example, SONOS memory devices including a gate structure of a tunneling oxide layer, a charge storage layer, and a blocking oxide layer, or any other memory device. Although example embodiments of the present invention have been shown and described, t will be understood by those of ordinary skill in the art that various changes in form and details may be made therein without departing from the spirit and scope of the present invention as defined by the following claims.

What is claimed is:

1. A method of manufacturing a barrier layer structure for use in a memory device, the method comprising:
    forming a first barrier layer on the substrate;
    forming a second barrier layer on the first baffler layer using a material having a higher bandgap energy than the first baffler layer, and
    forming a third barrier layer on the second baffler layer using a material having a lower bandgap energy than the second barrier layer wherein the first barrier layer, the second barrier layer, and the third barrier layer have different bandgap energies.

2. A method of manufacturing a memory device, the method comprising:
    forming a gate structure including a multilayered tunnelling barrier layer formed of at least three layers having different bandgap energies on a substrate;
    etching both lateral portions of the gate structure to expose surfaces of the substrate; and
    implanting the surfaces of the substrate with dopant to form a source region and a drain region.

3. The method of claim 2, wherein the forming of the gate structure further includes,
    forming a first barrier layer on the substrate;
    forming a second barrier layer on the first barrier layer using a material having a higher bandgap energy than the first barrier layer, and
    forming a third barrier layer on the second barrier layer using a material having a lower bandgap energy than the second barrier layer.

4. The method of claim 3, wherein the second barrier layer is formed of at least one of $SiO_2$, SiN, and $Al_2O_3$.

5. The method of claim 3, wherein the first barrier layer is formed of at least one of MO, MSiO, MSiON, and MON, wherein
    M is at least one of Hf, Zr, Ti, Ta, Al, Ln (lanthanized series) and an alloy metal.

6. The method of claim 3, wherein the third barrier layer is formed of at least one of MO, MSiO, MSiON, and MON, wherein
    M is at least one of Hf, Zr, Ti, Ta, Al, Ln (lanthanized series) and an alloy metal.

7. A barrier layer structure for use in a memory device, the barrier layer structure comprising:
    a first barrier layer formed on a substrate;
    a second barrier layer formed on the first barrier layer, and having a higher bandgap energy than the first barrier layer, and
    a third barrier layer formed on the second barrier layer, and having a lower bandgap energy than the second barrier layer wherein the first barrier layer, the second barrier layer, and the third barrier layer have different bandgap energies.

8. The barrier layer structure of claim 7, the first barrier layer contacts a source and a drain region within the substrate.

9. The barrier layer structure of claim 7, wherein the second barrier layer is formed of at least one of $SiO_2$, SiN, and $Al_2O_3$.

10. The barrier layer structure of claim 7, wherein at least one of the first barrier layer and the third barrier layer is formed of at least one of MO, MSiO, MSiON, and MON, wherein
    M is at least one of Hf, Zr, Ti, Ta, Al, Ln (lanthanized series) and an alloy metal.

11. A memory device comprising:
    a substrate;
    a source region and a drain region formed in the substrate; and
    a gate structure formed on the substrate and contacting the source and drain regions; wherein
        the gate structure includes a multilayered tunnelling barrier layer formed of at least three layers having different bandgap energies, the multilayered tunnelling barrier layer including a first barrier layer formed on the substrate and contacting the source and drain regions, a second barrier layer formed on the first barrier layer, and a third barrier layer formed on the second barrier layer, and wherein the second barrier layer has a wider energy bandgap than the first and third barrier layers.

12. The device of claim 11, wherein the gate structure includes the multilayered tunnelling barrier layer, a floating gate, a blocking oxide layer, and a gate electrode layer formed sequentially.

13. The device of claim 11, wherein the gate structure includes the multilayered tunnelling barrier layer, a charge storage layer, a blocking oxide layer, and a gate electrode layer, formed sequentially.

14. The device of claim 13, wherein the multilayered tunnelling barrier layer further includes, a first barrier layer formed on the substrate and contacting the source and drain regions, a second barrier layer formed on the first barrier layer, and a third barrier layer formed on the second barrier layer.

15. The device of claim 11, wherein the second barrier layer is formed of at least one of $SiO_2$, SiN, and $Al_2O_3$.

16. The device of claim 11, wherein the first barrier layer is formed of at least one of MO, MSiO, MSiON, and MON, wherein M is at least one of Hf, Zr, Ti, Ta, Al, Ln (lanthanized series) and an alloy metal.

17. The device of claim 11, wherein the third barrier layer is formed of at least one of MO, MSiO, MSiON, and MON, wherein M is at least one of Hf, Zr, Ti, Ta, Al, Ln (lanthanized series) and an alloy metal.

* * * * *